United States Patent
Violette et al.

(10) Patent No.: US 7,276,414 B2
(45) Date of Patent: Oct. 2, 2007

(54) NAND MEMORY ARRAYS AND METHODS

(75) Inventors: Michael Violette, Boise, ID (US); Garo Derderian, Boise, ID (US); Todd R. Abbott, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 357 days.

(21) Appl. No.: 10/920,561

(22) Filed: Aug. 18, 2004

(65) Prior Publication Data

US 2006/0040447 A1    Feb. 23, 2006

(51) Int. Cl.
*H01L 21/336* (2006.01)
(52) U.S. Cl. .................. 438/258; 438/981; 257/E21.69
(58) Field of Classification Search ............... 438/258, 438/266, 981; 257/E21.69
See application file for complete search history.

(56) References Cited

U.S. PATENT DOCUMENTS

| | | | | |
|---|---|---|---|---|
| 5,149,667 A | * | 9/1992 | Choi | 438/277 |
| 6,268,251 B1 | * | 7/2001 | Zhong et al. | 438/981 |
| 6,376,876 B1 | * | 4/2002 | Shin et al. | 257/315 |
| 2001/0014503 A1 | * | 8/2001 | Iguchi et al. | 438/261 |

* cited by examiner

*Primary Examiner*—Chandra Chaudhari
(74) *Attorney, Agent, or Firm*—Leffert Jay & Polglaze, P.A.

(57) ABSTRACT

NAND memory arrays and methods are provided. A plurality of first gate stacks is formed on a first dielectric layer that is formed on a substrate of a NAND memory array. The first dielectric layer and the plurality of first gate stacks formed thereon form a NAND string of memory cells of the memory array. A second gate stack is formed on a second dielectric layer that is formed on the substrate adjacent the first dielectric layer. The second dielectric layer with the second gate stack formed thereon forms a drain select gate adjacent an end of the NAND string. The second dielectric layer is thicker than the first dielectric layer.

45 Claims, 5 Drawing Sheets

NAND MEMORY ARRAYS AND METHODS

TECHNICAL FIELD OF THE INVENTION

The present invention relates generally to memory devices and in particular the present invention relates to NAND memory arrays and methods.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word-select line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word-select line connected to a control gate of a memory cell. In addition, the word-select lines connected to the control gates of unselected memory cells of each string are driven to operate the unselected memory cells of each string as pass transistors, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines.

To prevent programming of unselected strings while selected strings are being programmed, the voltage level of the unselected strings is increased. However, current leakage (often referred to as gate-induced drain leakage or GIDL) through the drain select gates acts to reduce the increased voltage level of the unselected strings that can cause inadvertent programming of these strings and can reduce programming speeds.

For the reasons stated above, and for other reasons stated below which will become apparent to those skilled in the art upon reading and understanding the present specification, there is a need in the art for reducing current leakage from drain select gates of unselected NAND strings.

SUMMARY

The above-mentioned problems with current leakage from drain select gates of unselected NAND strings and other problems are addressed by the present invention and will be understood by reading and studying the following specification.

For one embodiment, the invention provides a method of forming a NAND memory array that includes forming a plurality of first gate stacks on a first dielectric layer formed on a substrate, where the first dielectric layer and the plurality of first gate stacks formed thereon form a NAND string of memory cells of the memory array. The method includes forming a second gate stack on a second dielectric layer formed on the substrate adjacent the first dielectric layer, where the second dielectric layer with the second gate stack formed thereon forms a drain select gate adjacent an end of the NAND string and where the second dielectric layer is thicker than the first dielectric layer.

For another embodiment, the invention provides a method of forming a NAND memory array that includes forming a first dielectric layer on a semiconductor substrate, forming a hard mask layer on the first dielectric layer, and removing a portion of the hard mask layer and the first dielectric layer to expose a portion of the substrate adjacent a remaining portion of the first dielectric layer. The method includes forming a second dielectric layer on the exposed portion of the substrate, where the second dielectric layer is thinner than the first dielectric layer. Removing the hard mask layer from the remaining portion of the first dielectric layer and forming a first gate stack on the first dielectric layer to form a drain select gate is included in the method. The method also includes forming a string of second gate stacks on the second dielectric layer to form a NAND string of floating-gate memory cells, where a first memory cell of the NAND string is adjacent the drain select gate.

For another embodiment, the invention provides a NAND memory array having a plurality of rows of memory cells and a plurality of columns of NAND strings of memory cells. Each NAND string selectively connected to a bit line through a drain select gate of the respective column. Each of the drain select gates has a first dielectric layer formed on a semiconductor substrate of the memory array and a control gate formed on the first dielectric layer. Each of the memory cells of the NAND strings has a second dielectric layer formed on the substrate adjacent the first dielectric layer, a floating gate formed on the second dielectric layer, a third dielectric layer formed on the floating gate, and a control gate formed on the third dielectric layer, where the first dielectric layer is thicker than the second dielectric layer.

Further embodiments of the invention include methods and apparatus of varying scope.

DETAILED DESCRIPTION

Figure 1:
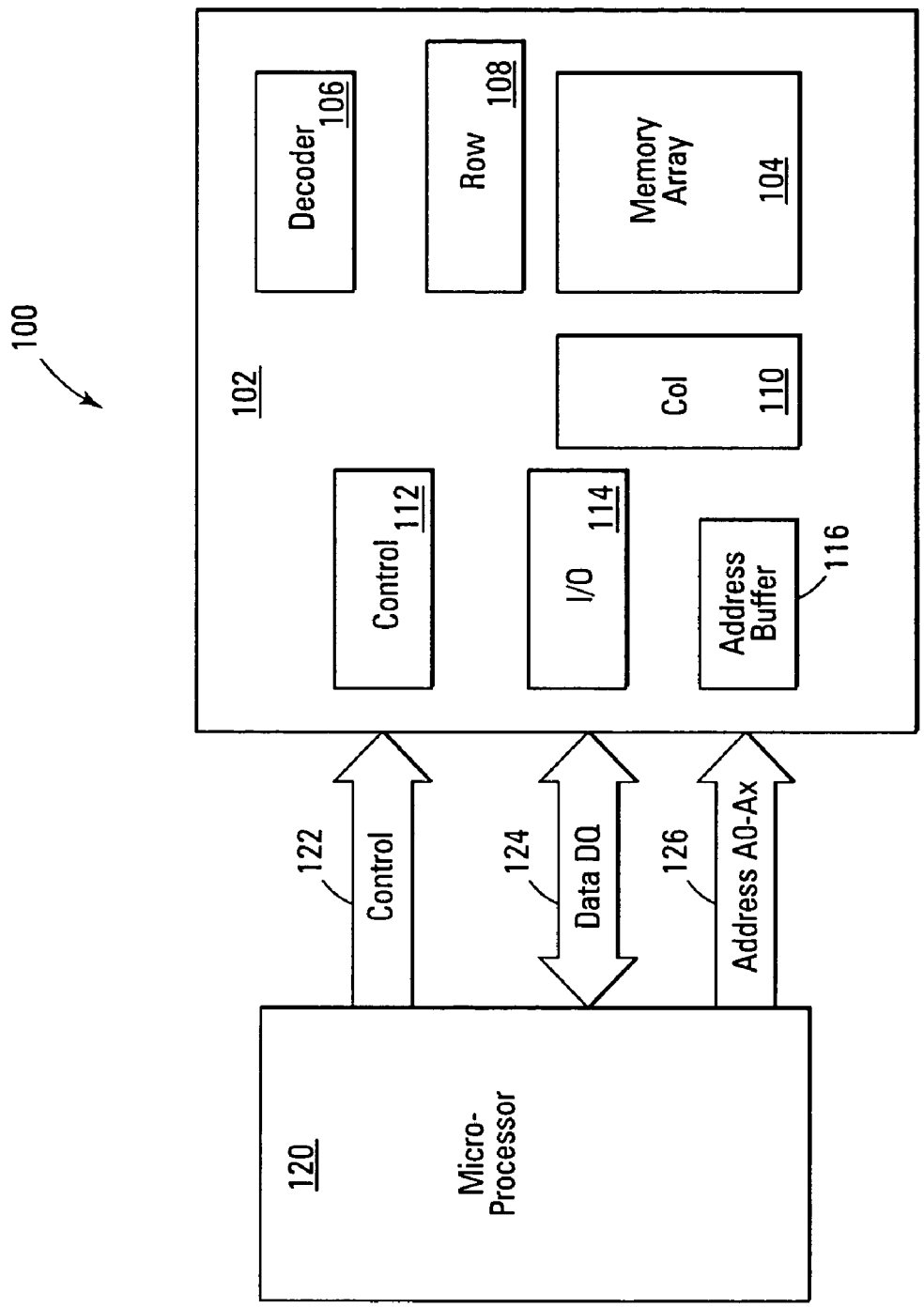
FIG. 1 is a simplified block diagram of a memory system, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a simplified block diagram of a memory system 100, according to an embodiment of the invention. Memory system 100 includes an integrated circuit flash memory device 102, e.g., a NAND memory device, that includes an array of flash memory cells 104, an address decoder 106, row access circuitry 108, column access circuitry 10, control circuitry 112, Input/Output (I/O) circuitry 114, and an address buffer 116. Memory system 100 includes an external microprocessor 120, or memory controller, electrically connected to memory device 102 for memory accessing as part of an electronic system.

The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

Figure 2:
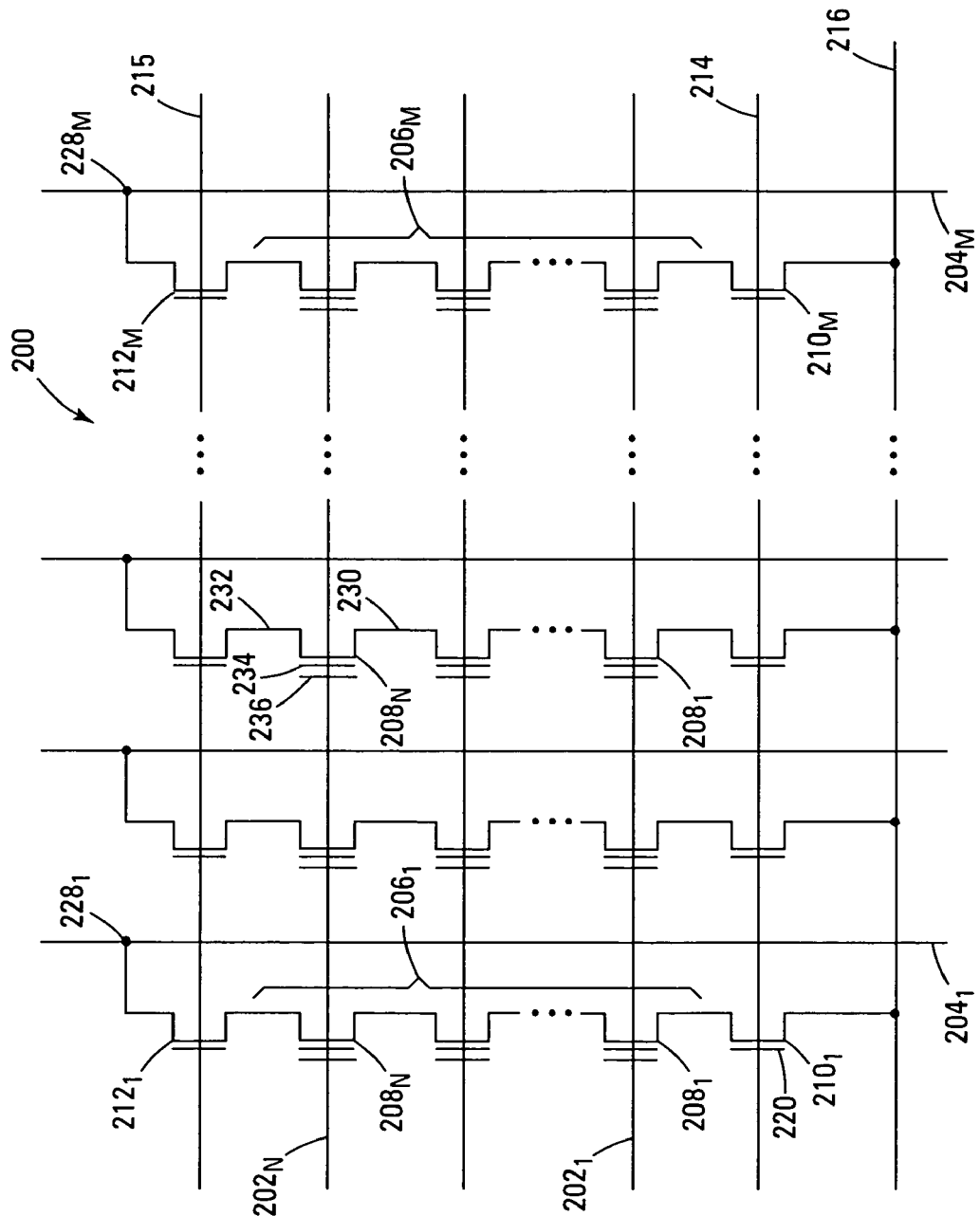
FIG. 2 is a schematic of a NAND memory array in accordance with another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

Figure 3A:
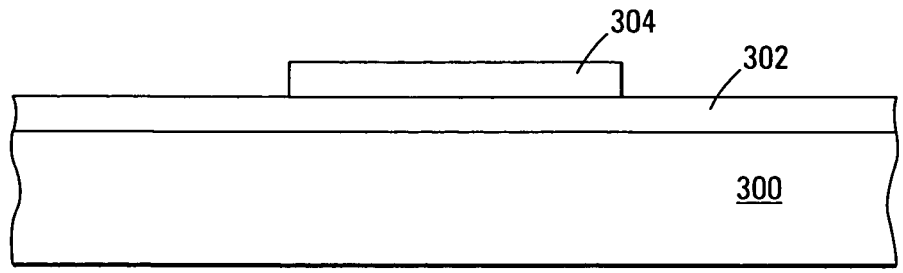
FIGS. 3A-3F are cross-sectional views of a portion of a memory array during various stages of fabrication, according to another embodiment of the invention.
Figure 3B:
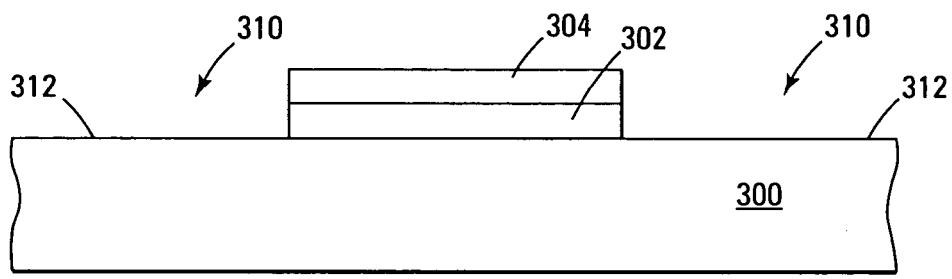

FIGS. 3A-3F are cross-sectional views of a portion of a memory array, such as a portion of the memory array 200 of FIG. 2, during various stages of fabrication, according to another embodiment of the invention. In FIG. 3A a first dielectric layer 302, e.g., an oxide layer, is formed, e.g., blanket deposited or thermally grown, on a semiconductor substrate 300 that is of monocrystalline silicon or the like. A hard mask layer 304 is formed on the first dielectric layer 302. The hard mask layer 304 can be a second dielectric layer, such as a nitride layer, e.g., a silicon nitride ($Si_3N_4$) layer, that is blanket deposited on the first dielectric layer 302. Hard mask layer 304 is patterned and portions thereof are removed, e.g., by dry etching, in regions 310 where NAND strings of memory cells, such as floating gate memory cells, e.g., floating-gate transistors, will be formed, as shown in FIG. 3B. For one embodiment, the first dielectric layer 302 is removed from regions 310 to expose portions 312 of substrate 300 in regions 310, as shown in FIG. 3B. For one embodiment, a selective dry etch that stops at substrate 300 accomplishes this.

Figure 3C:
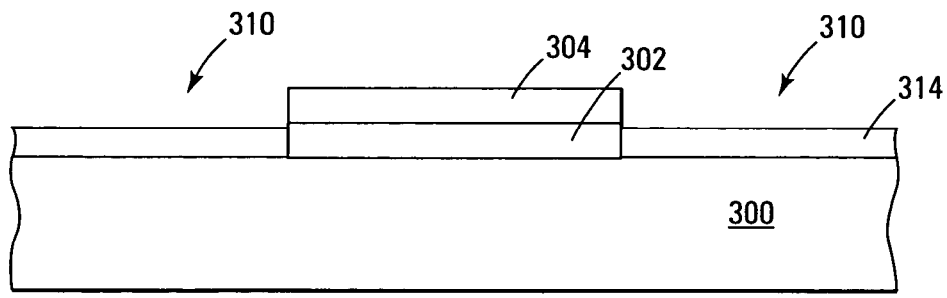
Figure 3D:
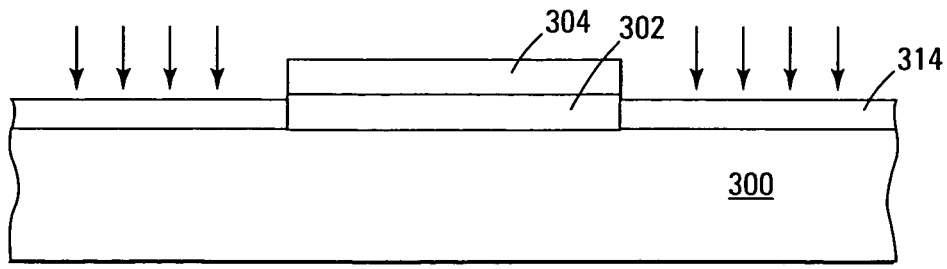

A third dielectric layer 314, e.g., an oxide layer, is formed, e.g., thermally grown, on the exposed portions 312 of substrate 300 in FIG. 3C. The third dielectric layer 314 is subsequently nitridized. For one embodiment, nitridation is performed by exposing the third dielectric layer 314 to a nitrogen-containing environment, e.g., an environment containing NO, $N_2O$, $NH_3$, etc. at an elevated temperature, in FIG. 3D. The remaining portion of hard mask layer 304 is removed in FIG. 3E.

Figure 3E:
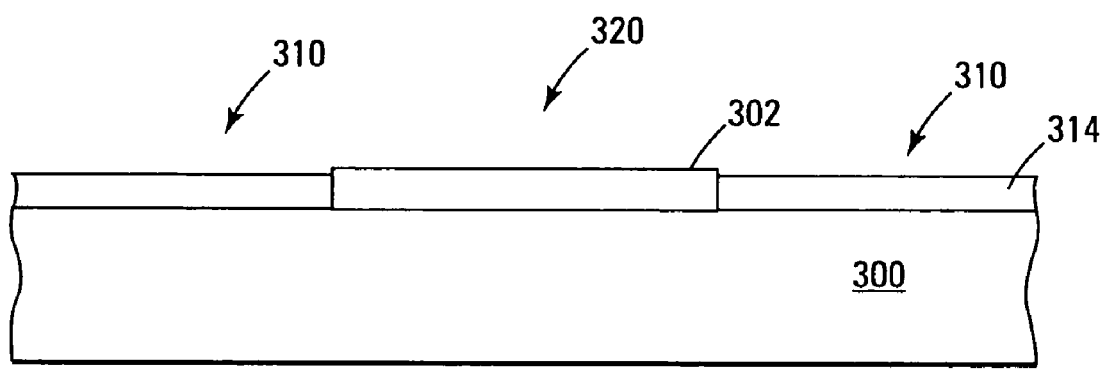

The resulting structure of FIG. 3E includes the first dielectric layer (or gate dielectric layer) 302 in a region 320 where drain select gates will be formed and the third dielectric layer (or tunnel dielectric layer) 314 in the regions 310 where the NAND strings will be formed. Note that the first dielectric layer 302 in region 320 can be thicker than the third dielectric layer 314 in the regions 310. The thicker first dielectric layer 302 acts to reduce gate-induced drain leakage or GIDL through the drain select gates. Note further that hard mask layer 304 prevents nitridation of first dielectric layer 302, where nitridation may negatively affect performance of the drain select gates and is not desired, but allows nitridation of third dielectric layer 314, where the nitridation acts to improve reliability of the memory cells.

Figure 3F:
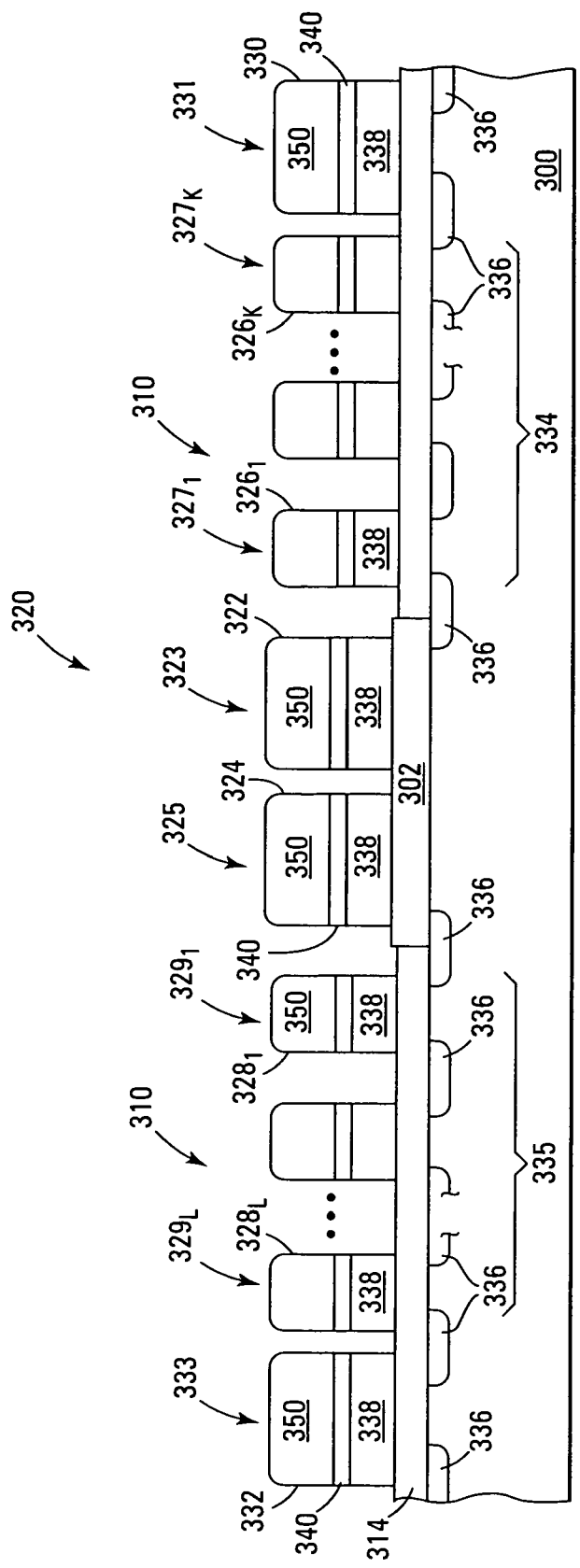

FIG. 3F illustrates gate stacks 322 and 324 formed on the first dielectric layer 302 and gate stacks 326 and 328 formed on the third dielectric layer 314. Note that FIG. 3F has been enlarged for clarity. Gate stacks 322 and 324 and the first dielectric layer 302 form drain select gates 323 and 325, e.g., field effect transistors (FETs), where the first dielectric layer 302 acts as a gate dielectric layer of drain select gates 323 and 325. Gate stacks 326 and the third dielectric layer 314 form floating-gate memory cells 327, such as floating-gate transistors, and gate stacks 328 and the third dielectric layer 314 form floating-gate memory cells 329, such as floating-gate transistors, where the third dielectric layer 314 acts as a tunnel dielectric layer for memory cells 327 and 329. Gate stacks 330 and 332 are also formed on the third dielectric layer 314. Gate stacks 330 and 332 and the third dielectric layer 314 form source select gates 331 and 333, e.g., field effect transistors (FETs), where the third dielectric layer 314 acts as a gate dielectric layer of source select gates 331 and 333. It will be apparent that the process could be readily modified to form a source select gates 331 and 333 on portions of the first dielectric layer 302 similar to drain select gates 323 and 325 if desired.

Memory cells 327 are connected in series, source to drain, between drain select gate 323 and source select gate 331 to form a NAND string 334 between drain select gate 323 and source select gate 331. Memory cells 329 are connected in series, source to drain, between drain select gate 325 and source select gate 333 to form a NAND string 335 between drain select gate 325 and source select gate 333. For one embodiment, source/drain regions 336 are formed in substrate 300. For another embodiment, successive memory cells of the respective NAND strings share a source/drain region 336, drain select gate 323 and memory cell $327_1$ of NAND string 334 share a source/drain region 336, source select gate 331 and memory cell $327_K$ of NAND string 334 of NAND string 334 share a source/drain region 336, drain select gate 325 and memory cell $329_1$ of NAND string 335 share a source/drain region 336, and source select gate 333 and memory cell $329_L$ of NAND string 335 share a source/drain region 336.

Each of gate stacks 323 and 325 include a first conductive layer 338, such as a conductively doped polysilicon layer, formed on the first dielectric layer 302, a fourth dielectric layer 340 formed on the first conductive layer 338, and a second conductive layer 350 formed on the fourth dielectric layer 340. Each of gate stacks 326, 328, 330, and 332 include the first conductive layer 338 formed on the third dielectric layer 314, the fourth dielectric layer 340 formed on the first conductive layer 338, and the second conductive layer 350 formed on the fourth dielectric layer 340.

For one embodiment, the second conductive layer 350 is a conductively doped polysilicon layer or a metal or metal-containing layer, such as a refractory metal or refractory metal silicide layer. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals. For another embodiment, the second conductive layer 350 may be a single conductive layer of one or more conductive materials, e.g., metal or metal-containing materials, or two or more conductive layers, such as a metal or metal-containing layer formed on a conductively doped polysilicon layer. For one embodiment, the fourth dielectric layer 340 may be an oxide layer, a nitride layer, an oxide-nitride-oxide (ONO) layer, etc.

For each of the memory cells 327 and 329, the second conductive layer 350 is a control gate (or a word line, such as a word line 202 of FIG. 2), the first conductive layer 338 is a floating gate, and the fourth dielectric layer interposed between the first conductive layer 338 and the second conductive layer 350 is an intergate dielectric layer. For each of the drain select gates 323 and 325 and the source select gates 331 and 333, for some embodiments, the first conductive layer 338 and the second conductive layer 350 may be strapped (or shorted) together so that the shorted together first conductive layer 338 and second conductive layer 350 form a control gate of the respective select gates, where the control gate of each of the source select gates 331 and 333 is a source select line, such as a source select line 214 of FIG. 2, and the control gate of each of the drain select gates 323 and 325 is a drain select line, such as a drain select line 215 of FIG. 2. For another embodiment, the first conductive layer 338 and the second conductive layer 350 are not shorted together, and first conductive layer 338 forms the control gate of the respective select gates.

Formation of gate stacks 322, 324, 326, 328, 330, and 332 is well known and will not be detailed herein. Generally, the first conductive layer 338 is formed on the first dielectric layer 302 and the third dielectric layer 314. After the first conductive layer 338 is formed, it is patterned parallel to the plane of FIG. 3F. The fourth dielectric layer 340 is then formed on the first conductive layer 338, and the second conductive layer 350 is formed on the fourth dielectric layer 340. The second conductive layer 350 is patterned orthogonally to the patterning of the first conductive layer 338, and the second conductive layer 350, the fourth dielectric layer 340, and the first conductive layer 338 are removed, e.g., by selective etching that stops at the first dielectric layer 302 and the third dielectric layer 314, to expose portions of the first dielectric layer 302 between gate stacks 322 and 324, between gate stacks 322 and $326_1$, and between gate stacks 324 and $328_1$. This also exposes portions of the third dielectric layer 314 between gate stacks 322 and $326_1$, between gate stacks 324 and $328_1$, between gate stacks 330 and $326_K$, between gate stacks 332 and $328_L$, and between successive gate stacks 326 and successive gate stacks 328.

It is generally desirable to use the same processing for all of the gate stacks and to short the first and second conductive layers of the gate stacks of the drain and source select gates together, as described above. However, since the select gates function differently than the memory cells, the gate stacks of the select gates can be formed independently of the gate stacks of the memory cells.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a NAND memory array, comprising:
   forming a first dielectric layer on a first portion of a semiconductor substrate;
   forming a second dielectric layer on a second portion of the semiconductor substrate that is adjacent to the first portion of the semiconductor substrate so that the first and second dielectric layers are adjacent to each other, wherein the first dielectric layer is thicker than the second dielectric layer and wherein the second dielectric layer is formed independently of the first dielectric layer;
   forming a first gate stack on the first dielectric layer to form a drain select gate;
   forming a string of second gate stacks on the second dielectric layer to form a NAND string of floating-gate memory cells, wherein a first memory cell of the NAND string is adjacent the drain select gate; and
   forming a third gate stack on the second dielectric layer to form a source select gate adjacent a last memory cell of the NAND string.

2. The method of claim 1, wherein the source and drain select gates and the NAND string form a column of the memory array.

3. The method of claim 1, wherein the drain select gate and the first memory cell of the NAND string share a first source/drain region formed in the substrate and the source select gate and the last memory cell of the NAND string share a second source/drain region formed in the substrate.

4. The method of claim 1, wherein the drain select gate further comprises a drain select line formed on the first dielectric layer, the source select gate further comprises a source select line formed on the second dielectric layer, and each of the memory cells further comprises a floating gate formed on the second dielectric layer, an intergate dielectric layer formed on the floating gate, and a word line formed on the intergate dielectric layer.

5. The method of claim 1, wherein each of the memory cells and the source select gate further comprise a first conductive layer formed on the second dielectric layer, a third dielectric layer formed on the first conductive layer, and a second conductive layer formed on the third dielectric layer, and wherein the drain select gate comprises the first conductive layer formed on the first dielectric layer, the third dielectric layer formed on the first conductive layer, and the second conductive layer formed on the third dielectric layer.

6. The method of claim 5, wherein the first conductive layer is a polysilicon layer.

7. The method of claim 6, wherein the polysilicon layer is conductively doped.

8. The method of claim 6, wherein the second conductive layer is selected from the group consisting of a polysilicon layer, a metal layer, a metal-containing layer, a layer containing one or more conductive materials, and one or more conductive layers.

9. The method of claim 8, wherein the third dielectric layer comprises one or more layers of dielectric material.

10. The method of claim 8, wherein each of the first and second dielectric layers are oxide layers.

11. A method of forming a NAND memory array, comprising:
    forming a first dielectric layer on a first portion of a semiconductor substrate;
    forming a second dielectric layer on a second portion of the semiconductor substrate that is adjacent to the first portion of the semiconductor substrate so that the first and second dielectric layers are adjacent to each other, wherein the first dielectric layer is thicker than the second dielectric layer and wherein the second dielectric layer is formed independently of the first dielectric layer;
    nitridizing the second dielectric layer;
    forming a first gate stack on the first dielectric layer to form a drain select gate; and
    forming a string of second gate stacks on the nitridized second dielectric layer to form a NAND string of floating-gate memory cells, wherein a first memory cell of the NAND string is adjacent the drain select gate.

12. The method of claim 11 further comprises protecting the first dielectric layer from the nitridation.

13. A method of forming a NAND memory array, comprising:
    forming a plurality of first gate stacks on a first dielectric layer formed on a substrate, wherein the first dielectric layer and the plurality of first gate stacks formed thereon form a NAND string of memory cells of the memory array;
    forming a second gate stack on a second dielectric layer formed on the substrate adjacent the first dielectric layer, wherein the second dielectric layer with the second gate stack formed thereon forms a drain select gate adjacent a first end of the NAND string, and wherein the second dielectric layer is thicker than the first dielectric layer; and
    forming a third gate stack on the first dielectric layer adjacent a second end of the NAND string, wherein the first dielectric layer with the third gate stack formed thereon forms a source select gate adjacent the second end of the NAND string.

14. The method of claim 13, wherein the second gate stack comprises a drain select line formed on the second dielectric layer.

15. The method of claim 13, wherein the each of the first gate stacks comprises a floating gate formed on the first dielectric layer, an intergate dielectric layer formed on the floating gate, and a word line formed on the intergate dielectric layer.

16. The method of claim 13, wherein each of the first gate stacks comprises a first conductive layer formed on the first dielectric layer, a third dielectric layer formed on the first conductive layer, and a second conductive layer formed on the third dielectric layer, and wherein the second gate stack comprises the first conductive layer formed on the second dielectric layer, the third dielectric layer formed on the first conductive layer, and the second conductive layer formed on the third dielectric layer.

17. The method of claim 13, wherein the third gate stack comprises a source select line formed on the first dielectric layer.

18. The method of claim 13, wherein the source and drain select gates are field effect transistors and each of the memory cells is a floating-gate memory cell.

19. The method of claim 18, wherein each of the floating-gate memory cells is a floating-gate transistor.

20. The method of claim 13, wherein the source and drain select gates and the NAND string form a column of the memory array.

21. The method of claim 13, wherein the drain select gate and an adjacent memory cell of the NAND string share a source/drain region formed in the substrate.

22. A method of forming a NAND memory array, comprising:
    forming a plurality of first gate stacks on a first dielectric layer formed on a substrate, wherein the first dielectric layer and the plurality of first gate stacks formed thereon form a NAND string of memory cells of the memory array; and
    forming a second gate stack on a second dielectric layer formed on the substrate adjacent the first dielectric layer, wherein the second dielectric layer with the second gate stack formed thereon forms a drain select gate adjacent a first end of the NAND string, and wherein the second dielectric layer is thicker than the first dielectric layer;
    wherein the first dielectric layer is nitridized before forming the first gate stacks thereon.

23. A method of forming a NAND memory array, comprising:
    forming a first dielectric layer on a semiconductor substrate;
    forming a hard mask layer on the first dielectric layer;
    removing a portion of the hard mask layer and the first dielectric layer to expose a portion of the substrate adjacent a remaining portion of the first dielectric layer;
    forming a second dielectric layer on the exposed portion of the substrate, wherein the second dielectric layer is thinner than the first dielectric layer;
    removing the hard mask layer from the remaining portion of the first dielectric layer;
    forming a first gate stack on the first dielectric layer to form a drain select gate; and
    forming a string of second gate stacks on the second dielectric layer to form a NAND string of floating-gate memory cells, wherein a first memory cell of the NAND string is adjacent the drain select gate.

24. The method of claim 23 further comprises nitridizing the second dielectric layer before forming the second gate stacks thereon.

25. The method of claim 23 further comprises forming a third gate stack on the second dielectric layer to form a source select gate adjacent a last memory cell of the NAND string.

26. The method of claim 23, wherein forming a first dielectric layer on a semiconductor substrate comprises thermally growing the first dielectric layer on the semiconductor substrate.

27. The method of claim 23, wherein forming a second dielectric layer on the exposed portion of the substrate comprises thermally growing the second dielectric layer on the exposed portion of the substrate.

28. The method of claim 23, wherein removing a portion of the hard mask layer and the first dielectric layer to expose a portion of the substrate comprises patterning the hard mask layer and selectively etching through the hard mask layer and the first dielectric layer so as to stop at the substrate.

29. The method of claim 23, wherein first and second dielectric layers are thermal oxide layers.

30. The method of claim 23, wherein the hard mask layer is a nitride layer.

31. A method of forming a NAND memory array, comprising:
    forming a first dielectric layer on a semiconductor substrate;
    forming a hard mask layer on the first dielectric layer;
    patterning the hard mask layer for removing a portion of the hard mask layer and the first dielectric layer to expose a portion of the substrate adjacent a remaining portion of the first dielectric layer;
    removing the portion of the hard mask layer and the first dielectric layer to expose the portion of the substrate;
    forming a second dielectric layer on the exposed portion of the substrate, wherein the second dielectric layer is thinner than the first dielectric layer;
    removing the hard mask layer from the remaining portion of the first dielectric layer;
    forming a first conductive layer on the first and second dielectric layers;
    forming a third dielectric layer of the first conductive layer;
    forming a second conductive layer on the third dielectric layer;
    removing portions of the second conductive layer, the third dielectric layer, and the first conductive layer to expose portions of the first and second dielectric layers and to form a first gate stack on the first dielectric layer, a second gate stack on the second dielectric layer, and a string of third gate stacks on the second dielectric layer between the first and second gate stacks;
    wherein the first dielectric layer with the first gate stack formed thereon forms a drain select gate, the second dielectric layer with the second gate stack formed thereon forms a source select gate, and the second dielectric layer with the string of third gate stacks formed thereon forms a NAND string of memory cells between the drain and source select gates.

32. The method of claim 31 further comprises nitridizing the second dielectric layer before removing the hard mask layer.

33. The method of claim 31, wherein forming a first dielectric layer on a semiconductor substrate comprises thermally growing an oxide on the semiconductor substrate.

34. The method of claim 31, wherein forming a second dielectric layer on the exposed portion of the substrate comprises thermally growing an oxide layer on the exposed portion of the substrate.

35. The method of claim 31, wherein the hard mask layer is a nitride layer.

36. The method of claim 31, wherein the first conductive layer is a polysilicon layer.

37. The method of claim 31, wherein the second conductive layer is selected from the group consisting of a polysilicon layer, a metal layer, a metal-containing layer, a layer containing one or more conductive materials, and one or more conductive layers.

38. The method of claim 31, wherein the third dielectric layer comprises one or more layers of dielectric material.

39. The method of claim 31, wherein successive memory cells share a first source/drain region formed in the substrate, wherein the drain select gate and a first memory cell of the NAND string share a second source/drain region formed in the substrate, and wherein the source select gate and a last memory cell of the NAND string share a third source/drain region formed in the substrate.

40. A method of forming a NAND memory array, comprising:

forming a first oxide layer on a semiconductor substrate;

forming a nitride layer on the first oxide layer;

patterning the nitride layer for removing a portion of the nitride layer and the first oxide layer to expose a portion of the substrate adjacent a remaining portion of the first oxide layer;

removing the portion of the nitride layer and the first oxide layer to expose the portion of the substrate;

forming a second oxide layer on the exposed portion of the substrate, wherein the second oxide layer is thinner than the first oxide layer;

nitridizing the second oxide layer;

removing the nitride layer from the remaining portion of the first oxide layer;

forming a polysilicon layer on the first and second oxide layers;

forming a dielectric layer of the polysilicon layer;

forming a conductive layer on the dielectric layer;

removing portions of the conductive layer, the dielectric layer, and the polysilicon layer to expose portions of the first and second oxide layers and to form a first gate stack on the first oxide layer, a second gate stack on the second oxide layer, and a string of third gate stacks on the second oxide layer between the first and second gate stacks;

wherein the first oxide layer with the first gate stack formed thereon forms a drain select gate, the second oxide layer with the second gate stack formed thereon forms a source select gate, and the second oxide layer with the string of third gate stacks formed thereon forms a NAND string of memory cells between the drain and source select gates.

41. The method of claim 40, wherein the conductive layer is selected from the group consisting of a second polysilicon layer, a metal layer, a metal-containing layer, a layer containing one or more conductive materials, and one or more conductive layers.

42. The method of claim 40, wherein the dielectric layer comprises one or more layers of dielectric material, a third oxide layer, a second nitride layer, or an oxide-nitride-oxide layer.

43. The method of claim 40, wherein the source and drain select gates and the NAND string form a column of the memory array.

44. The method of claim 40, wherein forming a first oxide layer on a semiconductor substrate comprises thermally growing an oxide on the semiconductor substrate.

45. The method of claim 40, wherein forming a second oxide layer on the exposed portion of the substrate comprises thermally growing an oxide on the exposed portion of the substrate.

* * * * *